(12) United States Patent
Wu

(10) Patent No.: US 6,750,499 B2
(45) Date of Patent: Jun. 15, 2004

(54) SELF-ALIGNED TRENCH-TYPE DRAM STRUCTURE AND ITS CONTACTLESS DRAM ARRAYS

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 15 days.

(21) Appl. No.: 10/212,225

(22) Filed: Aug. 6, 2002

(65) Prior Publication Data

US 2004/0029342 A1 Feb. 12, 2004

(51) Int. Cl.[7] .................. H01L 29/76; H01L 29/94; H01L 31/119
(52) U.S. Cl. .................. 257/305; 257/301; 257/302; 257/303; 257/304; 438/244; 438/387
(58) Field of Search .................. 257/301–305; 438/243–249, 386–392

(56) References Cited

U.S. PATENT DOCUMENTS

| | | | | |
|---|---|---|---|---|
| 6,144,054 A | * | 11/2000 | Agahi et al. | 257/296 |
| 6,297,088 B1 | * | 10/2001 | King | 438/243 |
| 6,489,646 B1 | * | 12/2002 | Jang | 257/296 |
| 6,521,938 B2 | * | 2/2003 | Hamamoto | 257/304 |
| 6,605,838 B1 | * | 8/2003 | Mandelman et al. | 257/305 |
| 6,621,112 B2 | * | 9/2003 | Jaiprakash et al. | 257/301 |
| 6,630,379 B2 | * | 10/2003 | Mandelman et al. | 438/243 |

\* cited by examiner

*Primary Examiner*—David A. Zarneke
*Assistant Examiner*—Asok Kumar Sarkar
(74) *Attorney, Agent, or Firm*—Pro-Techtor International Services

(57) ABSTRACT

A self-aligned trench-type DRAM structure comprising a self-aligned DRAM capacitor structure and a self-aligned DRAM transistor structure are disclosed by the present invention, in which the self-aligned DRAM capacitor structure comprises a deep-trench capacitor region and a shallow-trench-isolation region being defined by a spacer technique and the self-aligned DRAM transistor structure comprises a scalable gate-stack region and a common-drain region being defined by another spacer technique. The self-aligned trench-type DRAM structure is used to implement two contactless DRAM arrays. A first-type contactless DRAM array comprises a plurality of metal bit-lines integrated with planarized common-drain conductive islands and a plurality of highly conductive word-lines. A second-type contactless DRAM array comprises a plurality of metal word-lines integrated with planarized conductive-gate islands and a plurality of common-drain conductive bit-lines.

18 Claims, 20 Drawing Sheets

US 6,750,499 B2

SELF-ALIGNED TRENCH-TYPE DRAM STRUCTURE AND ITS CONTACTLESS DRAM ARRAYS

BACKGROUND OF THE INVENTION

1. Field of the Invention

The present invention relates generally to a DRAM memory cell and its manufacturing method and, more particularly, to a self-aligned trench-type DRAM structure and its manufacturing methods.

2. Description of Related Art

A dynamic random-access-memory (DRAM) cell including an access transistor and a storage capacitor has become the most important storage element in electronic system, especially in computer and communication system. The DRAM density is increased very rapidly in order to decrease the cost per bit and, therefore, an advanced photolithography is needed to decrease the minimum-feature-size (F) of a cell.

The output voltage of a DRAM cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench-type or a stack-type. The trench-type is formed by forming a deep trench in a semiconductor substrate without increasing the surface area of the semiconductor-substrate surface; however, the deep-trench formation becomes very difficult as the minimum-feature-size is smaller than 0.15 μm. The stack-type is formed by implementing a capacitor structure over the access transistor and its nearby dummy-transistor structure through the conductive contact-plug over the node diffusion region of the access transistor; however, the finite surface area over the access transistor becomes very difficult for forming a complicate capacitor structure as the minimum-feature-size is smaller than 0.15 μm.

Basically, the cell size of the stack-type DRAM is limited by a dummy transistor being formed over the isolation region. Accordingly, the limit cell size of the stack-type DRAM is $8F^2$ for shallow-trench-isolation. However, the cell size of a trench-type DRAM is limited by the space between nearby deep-trench capacitors and the separation between the access transistor and the deep-trench capacitor. Therefore, the limit cell size of a trench-type DRAM is also $8F^2$ if the separation between the access transistor and the trench capacitor can't be minimized.

A typical example of a trench-type DRAM cell is shown in FIG. 1, in which a deep trench is formed in a semiconductor substrate 100. A trench capacitor is formed in the lower portion of the deep trench, in which a lower capacitor node 101 is formed by a heavily-doped n+ diffusion region using arsenic-silicate-glass (ASG) as a diffusion source; an upper capacitor node 103a is made of doped polycrystalline-silicon; and a capacitor-dielectric layer 102 is formed by a composite dielectric layer such as an oxide-nitride-oxide structure or a nitride-oxide structure. An oxide collar 104 is used to separate the lower capacitor node 101 from a source diffusion region 105a, 105b, and a capacitor-node connector 103b being made of doped polycrystalline-silicon is used to electrically connect the upper capacitor node 103a to a source node 103c. The source node 103c is made of heavily-doped polycrystalline-silicon to act as a diffusion source for forming a n+ source diffusion region 105a. A shallow-trench-isolation (STI) region 106 is filled with a CVD-oxide layer in order to separate nearby trench capacitors. Two gate-stacks 108, 109 are formed over an upper surface, in which one gate-stack 108 is acted as a passing word line and another gate-stack 109 being acted as an excess transistor. A common-source diffusion region 105b and a common-drain diffusion region 107 for a bit-line node are formed in an upper surface of the semiconductor substrate 100. From FIG. 1, it is clearly seen that the limit cell size is $8F^2$ if the space between two nearby trench capacitors is defined to be a minimum-feature-size (F) of technology used. Apparently, the cell size can be further reduced if the separation between two adjacent deep trenches and the common-source region can be reduced. It is, therefore, a major objective of the present invention to offer a self-aligned trench-type DRAM structure for obtaining a cell size of $6F^2$ or smaller.

It is another objective of the present invention to offer a manufacturing method for forming the self-aligned trench-type DRAM structure with less masking photoresist steps.

It is a further objective of the present invention to offer two different contactless DRAM array structures for high-speed read and write operations.

SUMMARY OF THE INVENTION

A self-aligned trench-type DRAM structure and its contactless DRAM arrays are disclosed by the present invention. The self-aligned trench-type DRAM structure comprises a self-aligned DRAM capacitor structure and a self-aligned DRAM transistor structure, in which the self-aligned DRAM capacitor structure includes a deep-trench capacitor region and a shallow-trench-isolation region being defined by a first sidewall dielectric spacer and the self-aligned DRAM transistor structure includes a scalable gate-stack region and a common-drain region being defined by a third sidewall dielectric spacer. The deep-trench capacitor region comprises a lower capacitor node made of an n+ diffusion region being formed in the lower portion of a deep trench, a capacitor-dielectric layer being formed over the lower capacitor node, an upper capacitor node made of a planarized heavily-doped polycrystalline-silicon layer being formed over the capacitor-dielectric layer, a collar-oxide layer being formed over the capacitor-dielectric layer and a portion of the upper capacitor node, a source conductive layer integrated with a capacitor-node connector being formed on a portion of the upper capacitor node, and a common-source diffusion region being formed by out diffusion of the source conductive layer. The shallow-trench-isolation region being formed outside of the first sidewall dielectric spacer comprises a second-type planarized field-oxide layer with a bottom surface level slightly lower than that of the collar-oxide layer and an n+ diffusion region being formed under the second-type planarized field-oxide layer. A first planarized thick-oxide layer is formed over the deep-trench capacitor region and the second-type planarized field-oxide layer. The scalable gate-stack region comprises from top to bottom a third sidewall dielectric spacer, an elongated conductive-gate layer being acted as a word line, a conductive-gate layer, a gate-dielectric layer, and the common-source diffusion region being formed near the deep-trench capacitor region for forming a first-type DRAM cell; and comprises from top to bottom a planarized conductive-gate island being integrated with a metal word-line, a conductive-gate layer, a gate-dielectric layer, and a common-source diffusion region being formed near the deep-trench capacitor for forming a second-type DRAM cell. The common-drain region comprises a common-drain diffusion region having a shallow heavily-doped diffusion region formed within a lightly-doped diffusion region and a planarized common-drain conductive island integrated with a metal bit-line being formed on the common-drain diffusion region outside of a fourth sidewall dielectric spacer over a sidewall of the scalable gate-stack region for forming the first-type DRAM cell; and comprises a common-drain diffusion region having a shallow heavily-doped diffusion region formed within a lightly-doped diffusion region and a common-drain conductive bit-line being at least formed over the common-drain diffusion region outside of a fourth sidewall dielectric spacer over a sidewall of the scalable gate-stack region for forming the second-type DRAM cell. The cell size of the self-aligned trench-type DRAM structure can be fabricated to be smaller than $6F^2$.

The self-aligned trench-type DRAM structure of the present invention is used to implement two contactless DRAM arrays. A first-type contactless DRAM array comprises a plurality of first-type DRAM cells, a plurality of metal bit-lines integrated with the planarized common-drain conductive islands being patterned to be aligned above a plurality of active regions, and a plurality of elongated conductive-gate layers acted as a plurality of word lines being formed transversely to the plurality of metal bit-lines. A second-type contactless DRAM array comprises a plurality of second-type DRAM cells, a plurality of metal word-lines integrated with the planarized conductive-gate islands being patterned to be aligned above a plurality of active regions, and a plurality of highly conductive common-drain bus lines acted as a plurality of bit-lines being formed transversely to the plurality of metal word-lines.

DETAILED DESCRIPTION OF THE PREFERRED EMBODIMENTS

Figure 2A:
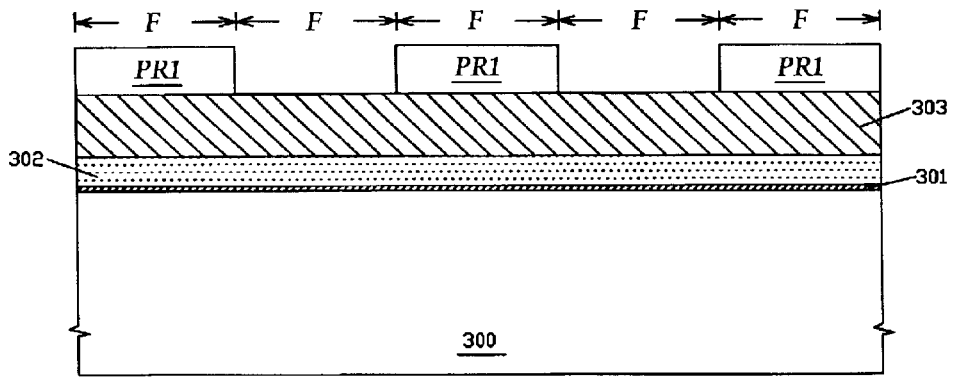
FIG. 2A through FIG. 2C show the process steps and their cross-sectional views of fabricating a shallow-trench-isolation structure for forming a self-aligned trench-type DRAM structure of the present invention.
Figure 2B:
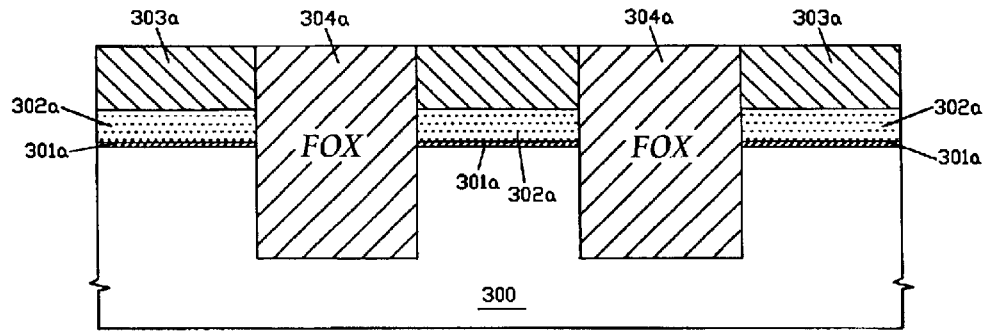
Figure 2C:
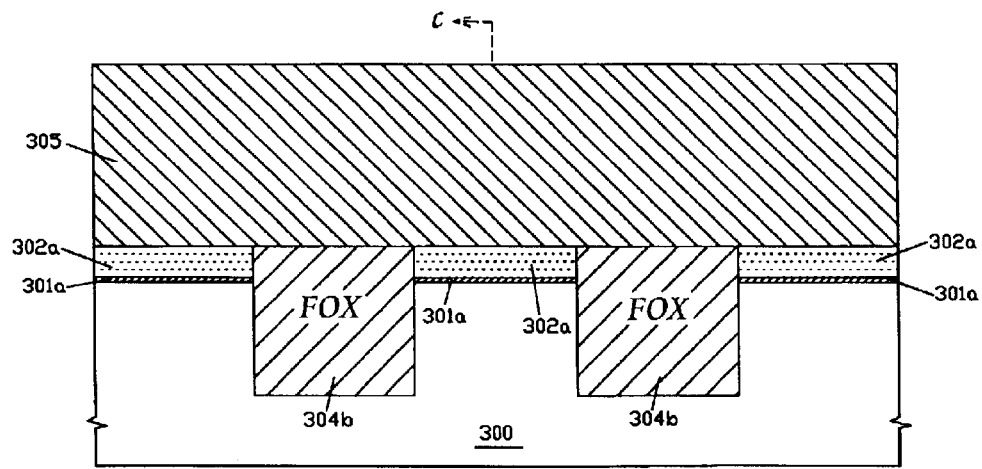

Referring now to FIG. 2A through FIG. 2C, there are shown the process steps and their cross-sectional views of fabricating a shallow-trench-isolation (STI) structure for forming a self-aligned trench-type DRAM structure of the present invention. FIG. 2A shows that a first gate-dielectric layer 301 is formed on a semiconductor substrate 300 of a first conductivity type, a first conductive layer 302 is formed on the first gate-dielectric layer 301, a first masking dielectric layer 303 is formed over the first conductive layer 302, and a plurality of masking photoresist PR1 are formed over the first masking dielectric layer 303 to define a plurality of active regions (under PR1) and a plurality of parallel first-type shallow-trench-isolation (STI) regions (outside of PR1). The first gate-dielectric layer 301 is preferably a thermal-oxide layer or a nitrided thermal-oxide layer and its thickness is preferably between 15 Angstroms and 120 Angstroms. The first conductive layer 302 is preferably a doped polycrystalline-silicon or doped amorphous-silicon layer as deposited by low-pressure chemical-vapor-deposition (LPCVD) and its thickness is preferably between 1000 Angstroms and 3000 Angstroms. The first masking dielectric layer 303 is preferably made of silicon-nitride as deposited by LPCVD and its thickness is preferably between 1000 Angstroms and 3000 Angstroms. It should be noted that a first anti-reflection coating (ARC) layer (not shown) can be formed over the first masking dielectric layer 303 to act as a hard masking layer for patterning the first masking dielectric layer 303.

FIG. 2B shows that the first masking dielectric layer 303, the first conductive layer 302, and the first gate-dielectric layer 301 outside of the plurality of masking photoresist PR1 are sequentially removed by using anisotropic dry etching; the semiconductor substrate 300 is then anisotropically etched to form first-type shallow trenches; the plurality of masking photoresist PR1 are then stripped; and subsequently, the first-type shallow trenches are refilled with first-type planarized field-oxide layers 304a. The depth of the first-type shallow trenches in the semiconductor substrate 300 is between; 4000 Angstroms and 10000 Angstroms. The first-type planarized field-oxide layer 304a is preferably made of silicon-oxide, phosphosilicate glass (p-glass), boro-phosphosilicate glass (BP-glass) as deposited by high-density plasma (HDP) CVD or plasma-enhanced (PE) CVD, and is formed by first depositing a thick-oxide film 304 to fill up each gap formed by the first-type shallow trenches and then planarizing the deposited thick-oxide film 304 using chemical-mechanical polishing (CMP) with the first masking dielectric layer 303a as a polishing stop.

FIG. 2C shows that the first-type planarized field-oxide layers 304a are etched back to a depth equal to a thickness of the first masking dielectric layer 303a to form first-type first raised field-oxide layers 304b and then the first masking dielectric layers 303a are removed by using hot-phosphoric acid or anisotropic dry etching; and subsequently, a second masking dielectric layer 305 is formed over a flat surface being alternately formed by a first conductive layer 302a and a first-type first raised field-oxide layer 304b.The second masking dielectric layer 305 is preferably made of silicon-nitride as deposited by LPCVD and its thickness is preferably between 3000 Angstroms and 10000 Angstroms. The cross-sectional view along an active region as indicated by a C–C' line is shown in FIG. 3A.

Figure 3A:
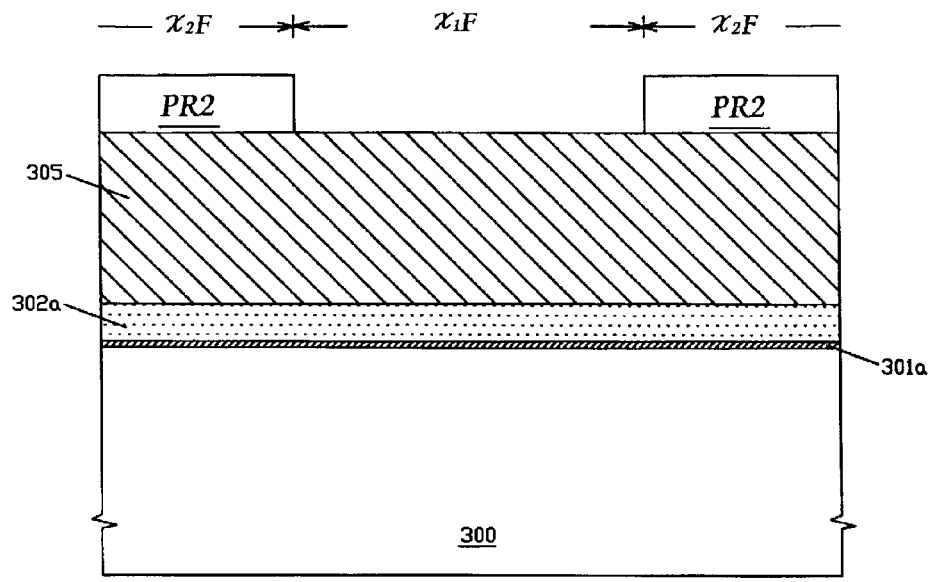
FIG. 3A through FIG. 3I show the process steps and their cross-sectional views of fabricating a self-aligned trench-type DRAM capacitor structure of the present invention.

Referring now to FIG. 3A through FIG. 3I, there are shown the process steps and their cross-sectional views of fabricating a self-aligned trench-type DRAM capacitor structure of the present invention on a shallow-trench-isolation structure shown in FIG. 2C. FIG. 3A shows that a plurality of masking photoresist PR2 are formed over the second masking dielectric layer 305 to define a plurality of self-aligned trench regions (between PR2) and a plurality of self-aligned transistor regions (under PR2). Each of the plurality of self-aligned trench regions includes a pair of deep-trench regions and a second-type shallow-trench region being located between the pair of deep-trench regions as indicated by $X_1F$. Each of the plurality of self-aligned transistor regions includes a pair of gate-stack regions and a common-drain region being located between the pair of gate-stack regions as indicated by $X_2F$. Similarly, a second anti-reflection coating (ARC) layer (not shown) can be formed over the second masking dielectric layer 305 to act as a hard masking layer to pattern the second masking dielectric layer 305. The first/second anti-reflection coating (ARC) layer is preferably made of boro-silicate glass (B-glass) as deposited by HDPCVD PECVD, APCVD, or LPCVD.

Figure 3B:
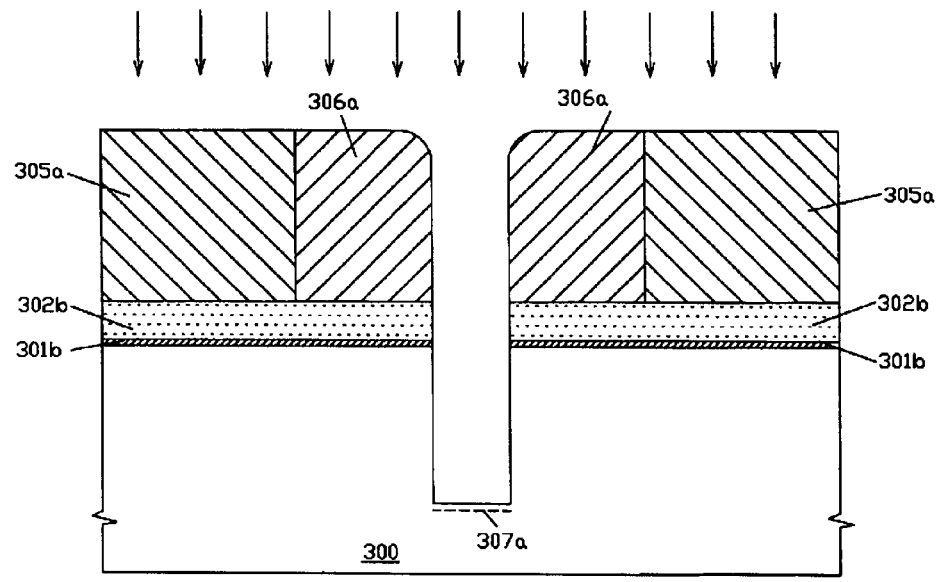

FIG. 3B shows that the second masking dielectric layer 305 outside of the plurality of masking photoresist PR2 are removed by anisotropic dry etching and the plurality of masking photoresist PR2 are stripped; a pair of first sidewall dielectric spacers 306a are then formed over inner sidewalls formed by the removed second masking dielectric layers 305 in each of the plurality of self-aligned trench regions; and subsequently, the first conductive layer 302a, the first gate-dielectric layer 301a between the pair of first sidewall dielectric spacers 306a are sequentially removed and the semiconductor substrate 300 in each of the plurality of active regions is anisotropically etched to form second-type shallow trenches in each of the plurality of self-aligned trench regions, and an ion-implantation can be preformed in a self-aligned manner to form an implant region 307a of a second conductivity type in each bottom semiconductor-surface region of the second-type shallow trenches. The first sidewall dielectric spacer 306a is preferably made of silicon-dioxide as deposited by LPCVD and is formed by first depositing a silicon-dioxide film 306 over the formed structure and then etching back a thickness of the deposited silicon-dioxide film 306.

Figure 3C:
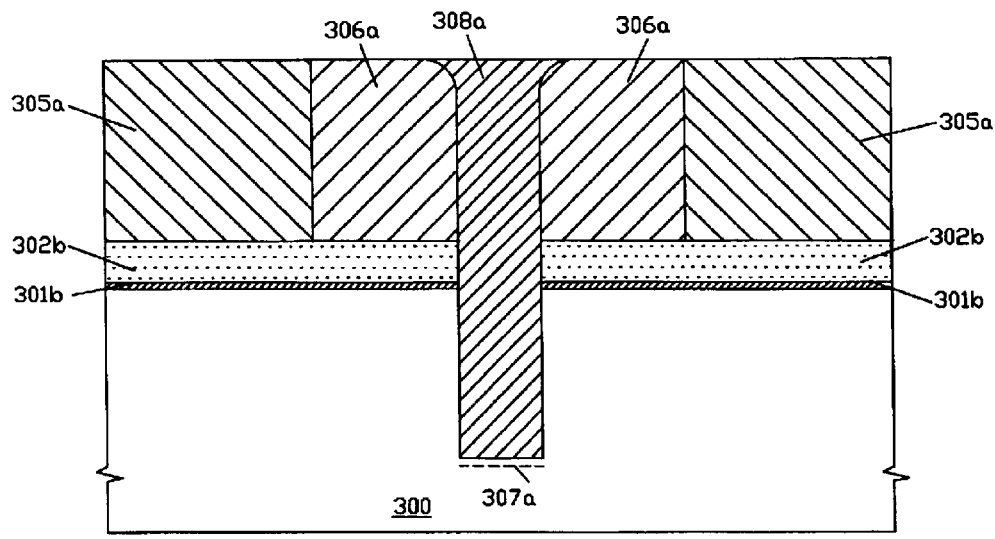

FIG. 3C shows that a second planarized field-oxide layer 308a is formed to fill up each gap between the pair of first sidewall dielectric spacers 306a. The second planarized field-oxide layer 308a is preferably made of silicon-dioxide as deposited by LPCVD and is formed by first depositing a silicon-dioxide film 308 to fill up each gap between the pair of first sidewall dielectric spacers 306a and then planarizing the deposited silicon-dioxide film 308 using CMP with the second masking dielectric layer 305a as a polishing stop.

Figure 3D:
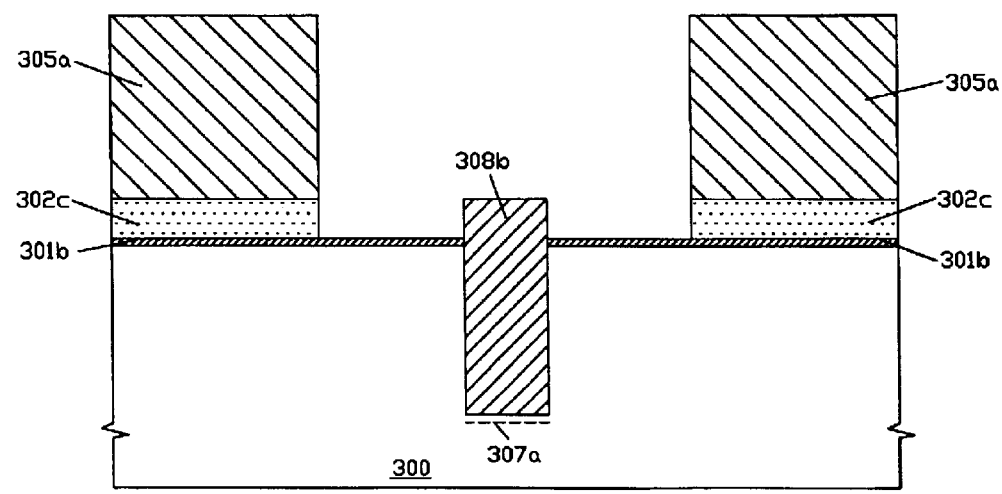

FIG. 3D shows that the pair of first sidewall dielectric spacers 306a and the second, planarized field-oxide layers 308a are simultaneously etched back to a depth equal to a thickness of the second masking dielectric layer 305a or are etched by a wet etching solution such as buffered hydrofluoric acid to form second-type first raised field-oxide layers 308b.

Figure 3E:
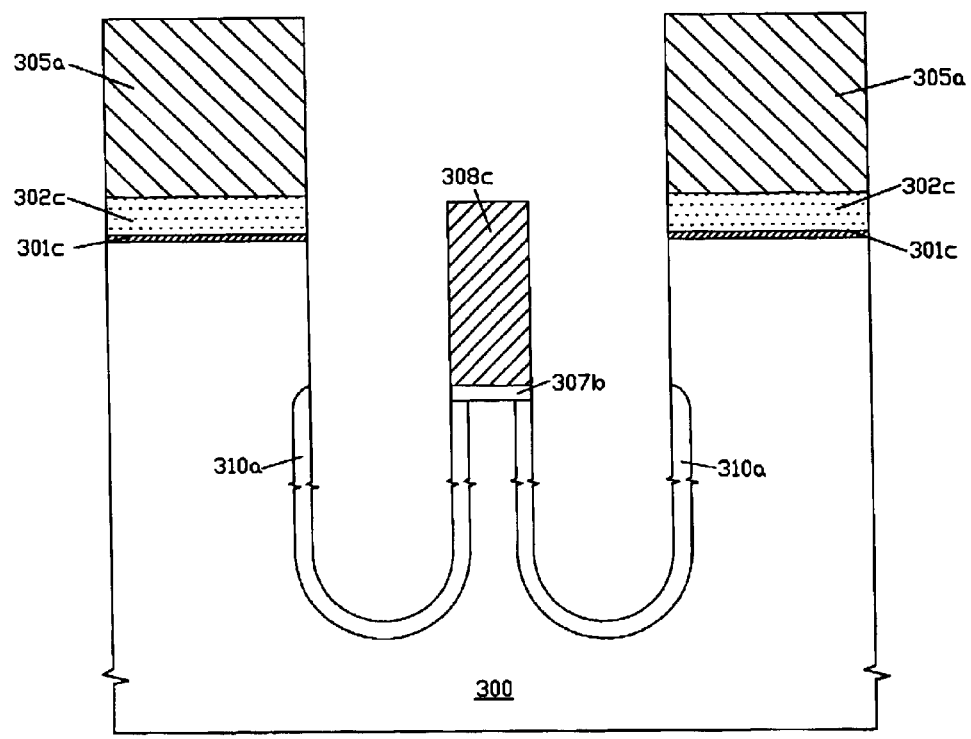

FIG. 3E shows that the first gate-dielectric layers 301b are selectively removed first by anisotropic dry etching, and the second-type first raised field-oxide layers 308b and the first-type first raised field-oxide layers 304b are simultaneously etched to form second-type second raised field-oxide layers 308c and first-type second raised field-oxide layers 304c (not shown) respectively, a plurality of deep trenches are then formed in the semiconductor substrate 300 of the plurality of active regions in each of the plurality of self-aligned trench regions, and thereafter a lower capacitor node 310a is formed over each lower portion of the deep trenches. The lower capacitor node 310a is a heavily-doped n+ diffusion region formed by an arsenic-silicate glass (ASG) film as a dopant diffusion source and can be formed by depositing an arsenic-silicate glass film over a whole structure surface including the sidewalls of the deep trenches, and a photoresist is formed and is then etched back to a level approximately equal to a bottom surface of the second-type second raised field-oxide layer 308c; and subsequently, the arsenic-silicate glass film above the etched-back photoresist is removed by dipping in dilute hydrofluoric acid and the etched-back photoresist are then stripped; and thereafter, a thin capping silicon-oxide layer is deposited over the formed structure surface including the arsenic-silicate glass films formed in the lower portion of the deep trenches and the upper portion of the deep trenches, and a drive-in process is performed to form the lower capacitor node 310a; the thin capping silicon-oxide layer and the arsenic-silicate glass films are then removed by dipping in dilute hydrofluoric acid. It should be noted that the thin capping silicon-oxide layer is mainly used to eliminate out-diffusion of dopant impurities in the arsenic-silicate glass films during the drive-in process.

Figure 3F:
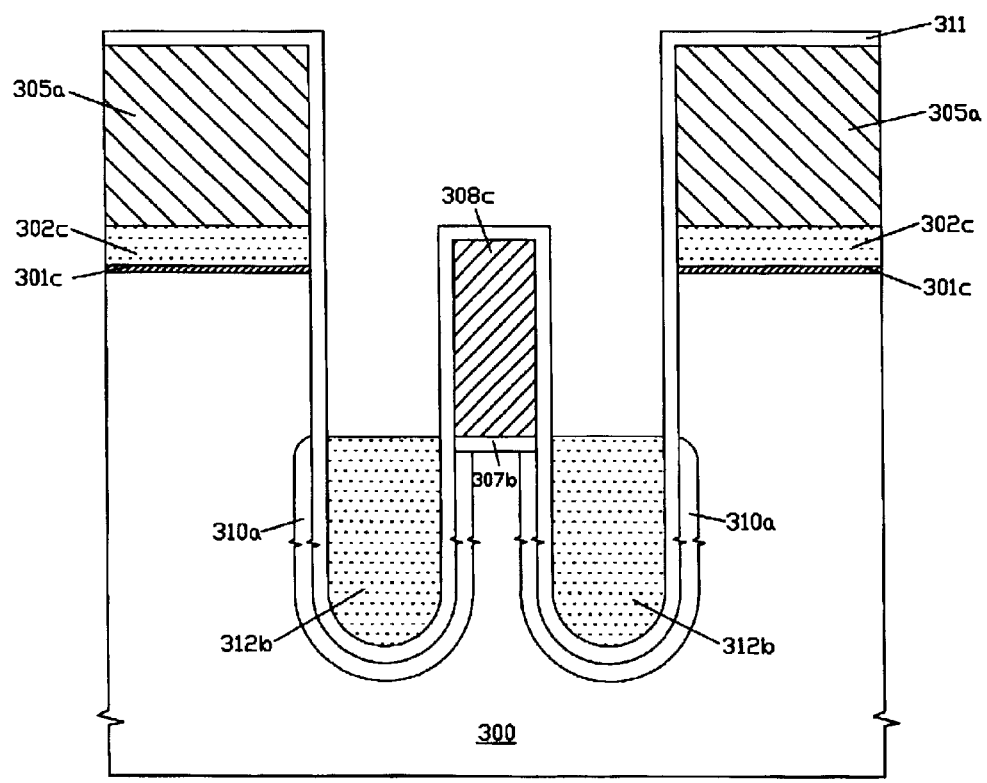

FIG. 3F shows that a capacitor-dielectric layer 311 is formed over the formed structure surface and an upper capacitor node 312b is formed in each of the plurality of self-aligned deep trenches. The capacitor-dielectric layer 311 is preferably a composite dielectric layer such as an oxide-nitride-oxide structure or a nitride-oxide (NO) structure. The upper capacitor node 312b is preferably made of doped polycrystalline-silicon and can be further implanted with a high dose of doping impurities of the second conductivity type (not shown), which is formed by first depositing a thick second conductive layer 312 to fill up each gap in each of the plurality of self-aligned trench regions and then planarizing the deposited thick second conductive layer 312 using CMP with the capacitor-dielectric layer 311a as a polishing stop to form planarized second conductive layers 312a and thereafter etching back the planarized second conductive layers 312a to a level approximately equal to a bottom surface of the second-type second raised field-oxide layers 308c to form the upper capacitor nodes 312b.

Figure 3G:
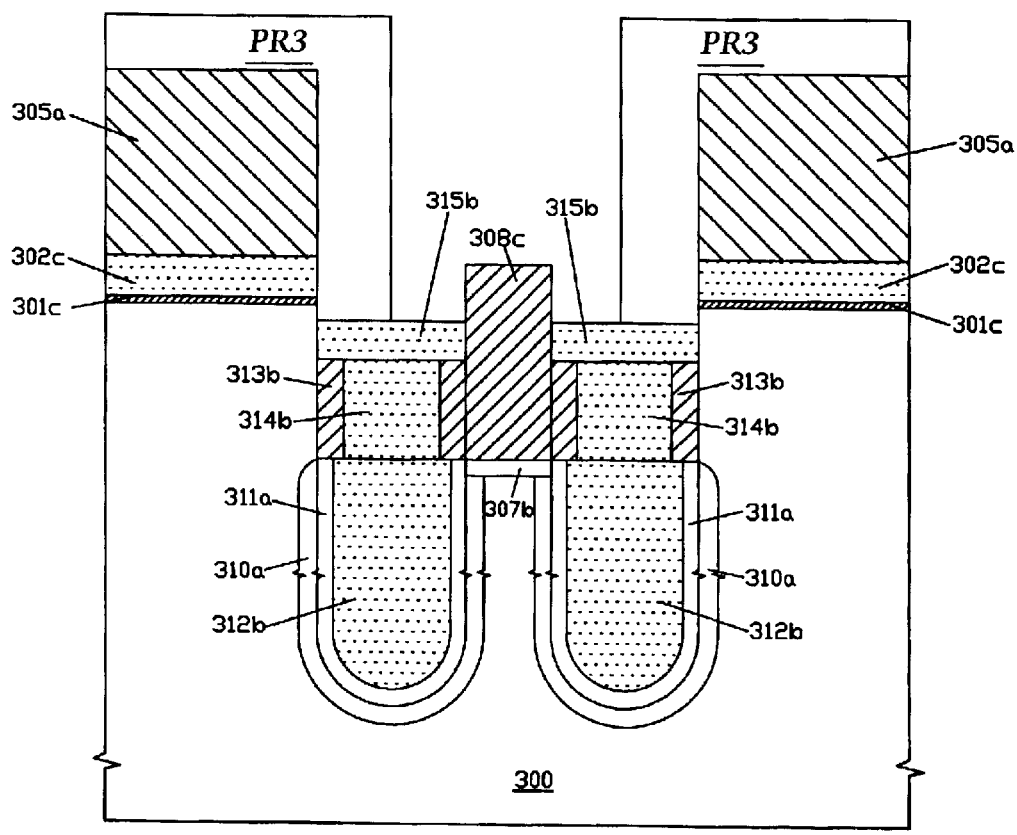
Figure 3G:
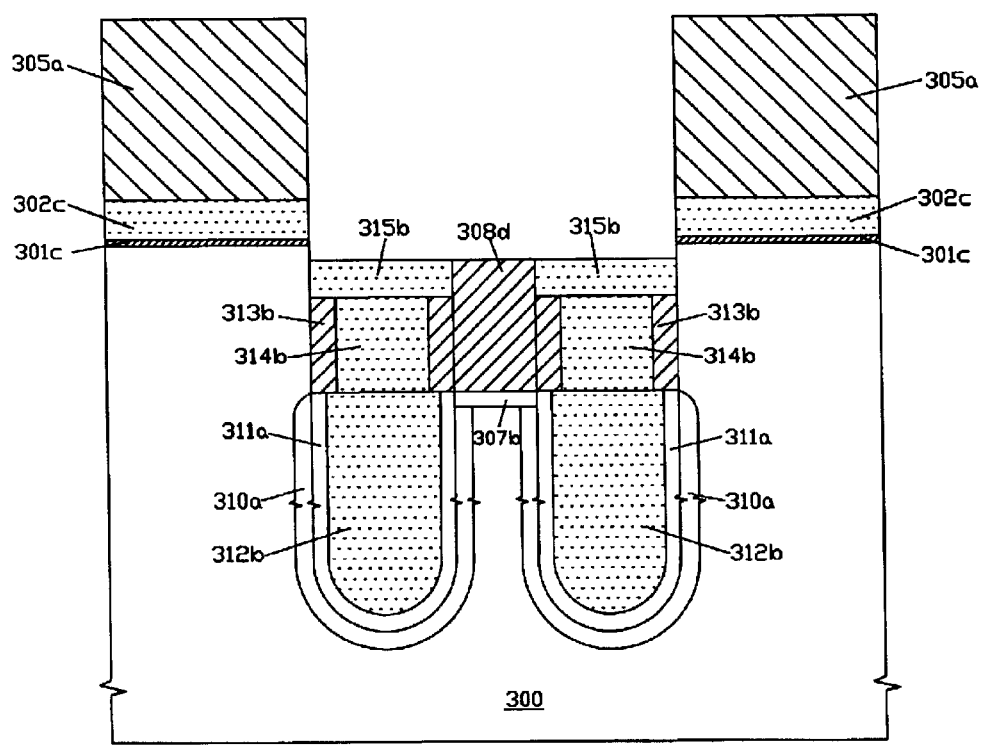

FIG. 3G(a) shows that the capacitor-dielectric layers 311 above the upper capacitor nodes 312b are removed preferably by wet-chemical solution and a collar-oxide layer 313b together with a capacitor-node conductive layer 314b are formed in each of the plurality of deep trenches; and thereafter, a source conductive layer 315b is formed over the collar-oxide layer 313b and the capacitor-node conductive layer 314b in each of the plurality of deep trenches; and subsequently, a plurality of masking photoresist PR3 are formed over the plurality of self-aligned transistor regions and a portion of nearby deep-trench regions. The collar-oxide layer 313b is formed by first depositing a silicon-dioxide film 313 over the formed structure surface and then etching back a thickness of the deposited silicon-dioxide film 313 to form a sidewall silicon-dioxide spacer 313a over each inner sidewall formed in each of the plurality of deep-trench regions; a planarized third conductive layer 314 is then formed to fill up a gap formed in each of the plurality of self-aligned trench regions and is etched back to a depth approximately equal to 500 Angstroms up to 2000 Angstroms below an upper surface of the semiconductor substrate 300 to form a capacitor-node conductive layer 314b; and an ion-implantation can be performed by implanting doping impurities of the second conductivity type to heavily dope the capacitor-node conductive layer 314b and thereafter, the sidewall silicon-dioxide spacer 313a above the capacitor-node conductive layer 314b in each of the plurality of deep trenches is removed. The source conductive layer 315b is preferably made of doped polycrystalline-silicon or intrinsic polycrystalline-silicon and is formed by first depositing a thick fourth conductive film 315 to fill up a gap formed in each of the plurality of self-aligned trench regions and then planarizing the deposited thick fourth conductive layer 315 using CMP with the second masking dielectric layer 305a as a polishing stop to form planarized fourth conductive layer 315a in each of the plurality of self-aligned trench regions, and the planarized fourth conductive layer 315a is then etched back to a level slightly below an upper surface of the semiconductor substrate 300 to form the source conductive layer 315b.

FIG. 3G(b) shows that the second-type second raised field-oxide layers 308c and the first-type second raised field-oxide layers 304c shown in FIG. 3G(a) are selectively etched back to the same level of the source conductive layer 315b to form second-type third raised field-oxide layers 308d and first-type third raised field-oxide layers 304d (not shown) by using anisotropic dry etching or wet etching.

Figure 3H:
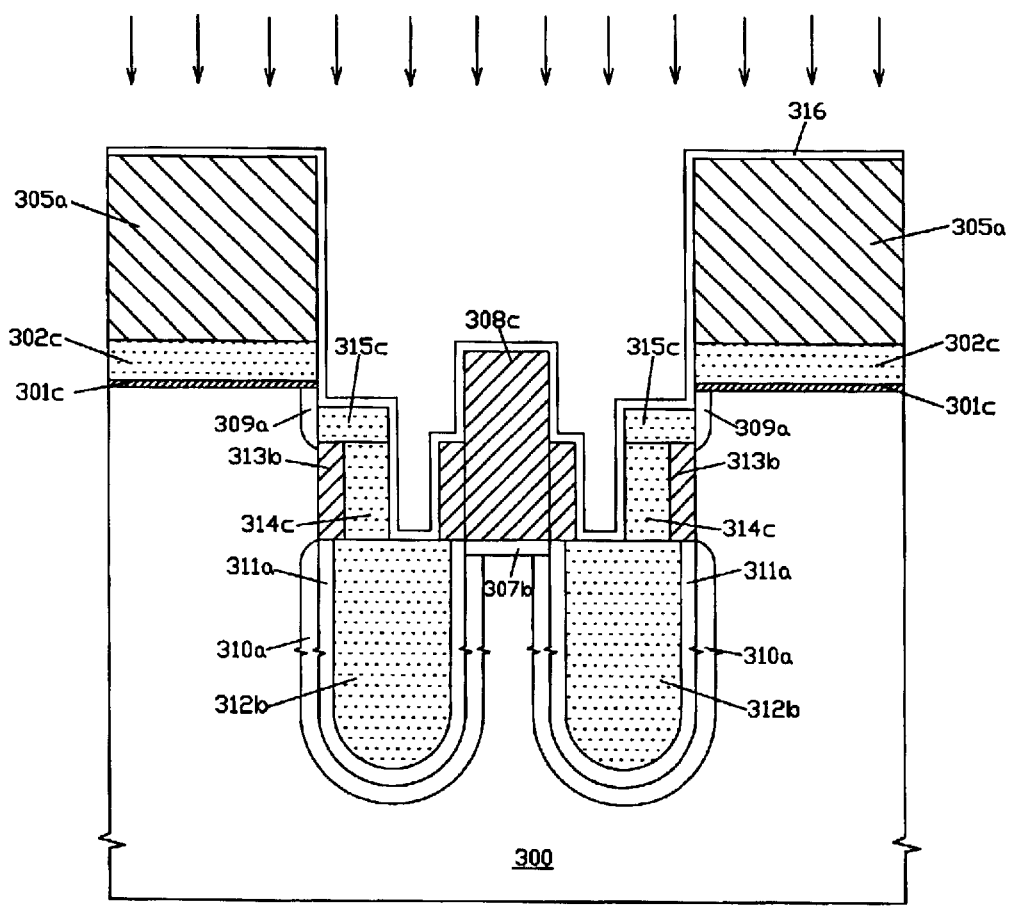
Figure 3H:
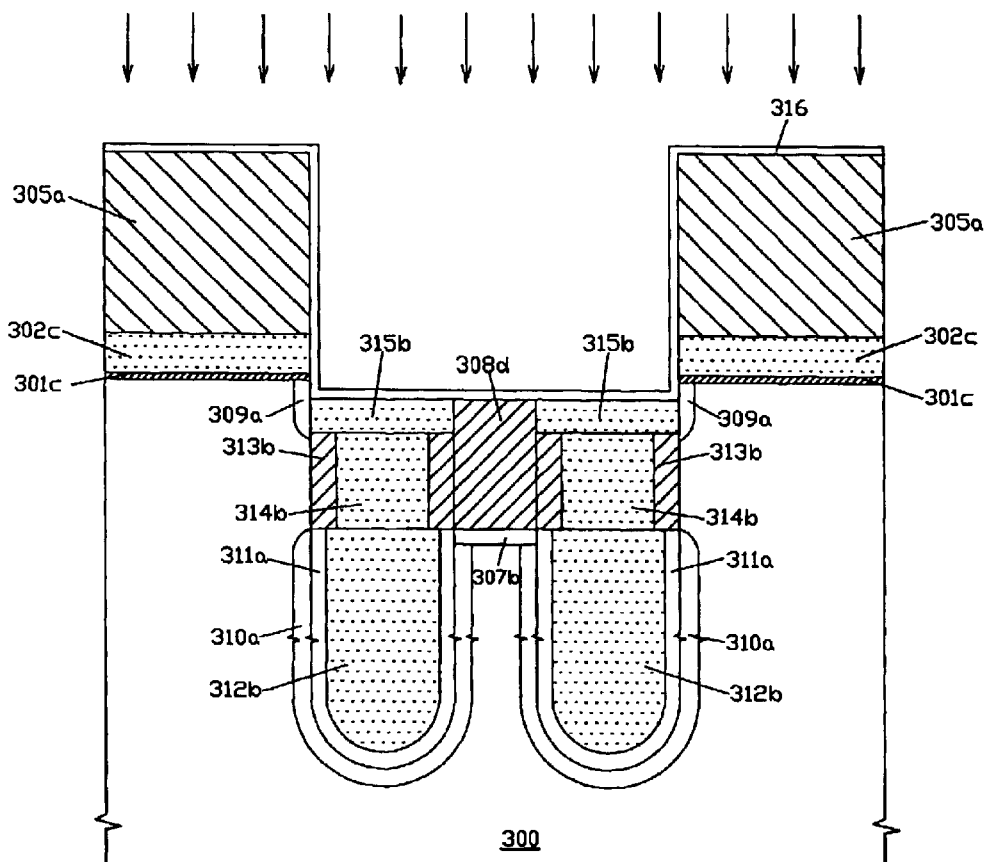

FIG. 3H(a) shows that the source conductive layer 315b and the capacitor-node conductive layer 314b outside of the plurality of masking photoresist PR3 are removed to form source conductive nodes 315c and capacitor-node connectors 314c and the plurality of masking photoresist PR3 are then stripped; a first thin silicon-dioxide layer 316 is then formed over the formed structure and an ion-implantation is performed by implanting a high dose of doping impurities of the second conductivity type across the first thin silicon-dioxide layers 316 into the source conductive nodes 315c to be acted as the dopant diffusion sources. A rapid-thermal-annealing (RTA) process can be performed later to form a common-source diffusion region 309a near each of the source conductive nodes 315c. The first thin silicon-dioxide layer 316 is preferably deposited by LPCVD or high-temperature-oxide (HTO) deposition and its thickness is preferably between 100 Angstroms and 500 Angstroms. The implanted doping impurities are preferably arsenic ions or phosphorous ions.

FIG. 3H(b) shows that a first thin silicon-dioxide layer 316 is formed over the formed structure shown in FIG. 3G(b) and an ion-implantation is then performed by implanting a high-dose of doping impurities of the second conductivity type across the first thin silicon-dioxide layers 316 into the source conductive layer 315b to be acted as the dopant diffusion sources; and a rapid-thermal-annealing (RTA) process can be performed later to form a common-source diffusion region 309a near each of the source conductive layers 315b.

Figure 3I:
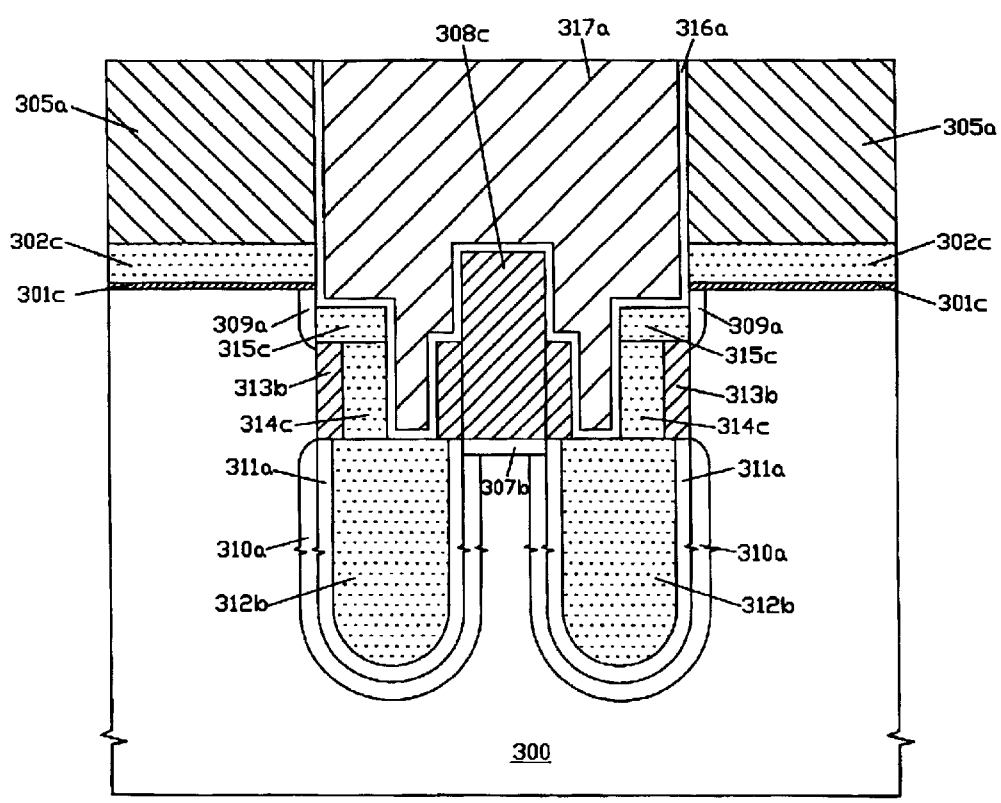
Figure 3I:
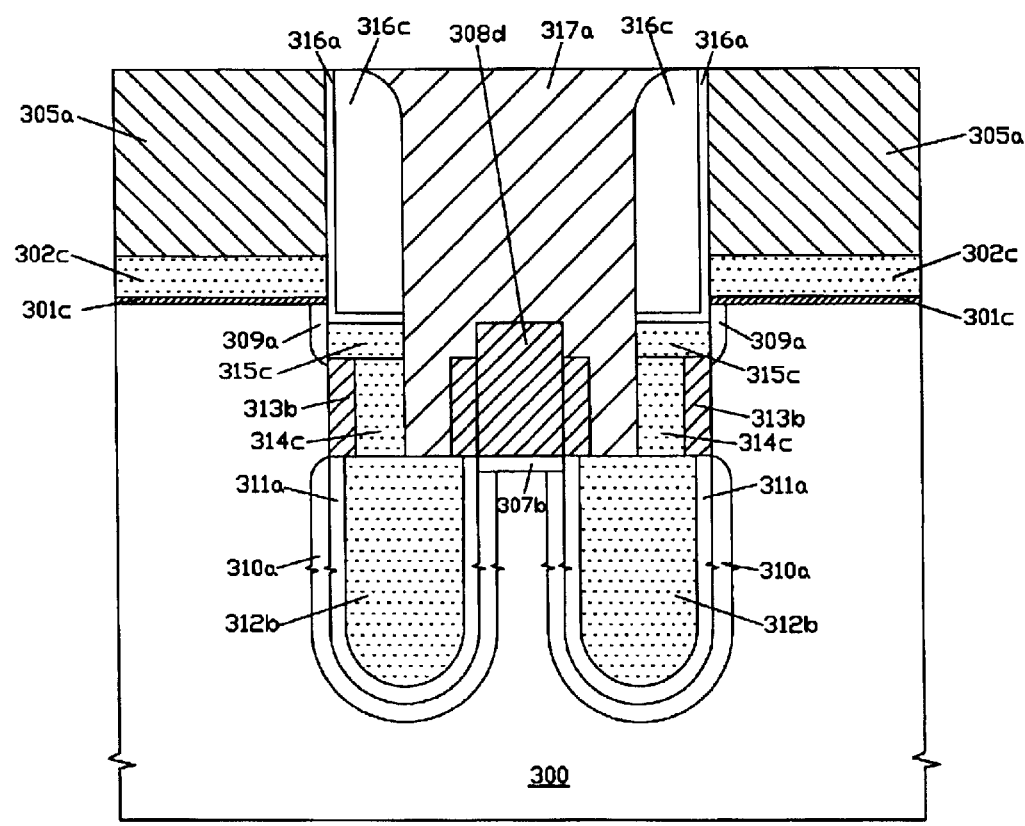

FIG. 3I(a) shows a first planarized thick-oxide layer 317a is formed over a gap in each of the plurality of self-aligned trench regions to form a first-type self-aligned DRAM capacitor structure of the present invention. The first planarized thick-oxide layer 317a is preferably made of silicon-dioxide, P-glass, or BP-glass as deposited by HDPCVD or PECVD and is formed by first depositing a thick-oxide film 317 to fill up a gap in each of the plurality of self-aligned trench regions and then planarizing the deposited thick-oxide film 317 using. CMP with the second masking dielectric layer 305a as a polishing stop.

FIG. 3I(b) shows that a pair of composite second sidewall dielectric spacers 316a/316c are formed over inner sidewalls in each of plurality of self-aligned trench regions and on a portion of the source conductive layers 315b and the first-type third raised field-oxide layers 304d; the source conductive layers 315b and the capacitor-node conductive layers 314b outside of the pair of composite second sidewall dielectric spacers 316a/316c are then removed and a first planarized thick-oxide layer 317a is formed over a gap in each of the plurality of self-aligned trench regions to form a second-type self-aligned DRAM capacitor structure of the present invention. The composite second sidewall dielectric spacer 316a/316c is formed by first depositing a thicker silicon-dioxide layer over the first thin silicon-dioxide layer 316 and then etching back a thickness of the thicker silicon-dioxide layer plus the first thin silicon-dioxide layer 316. Similarly, the first planarized thick-oxide layer 317a is preferably made of silicon-dioxide, p-glass; or BP-glass as deposited by HDPCVD or PECVD and is formed as described in FIG. 3I(a).

From FIG. 3I(a) and FIG. 3I(b), it is clearly seen that both DRAM capacitor structures are the same if the materials used for the composite second sidewall dielectric spacer 316a/316c, the first thin silicon-oxide layer 316a, and the first planarized thick-oxide layer 317a are the same.

Figure 1:
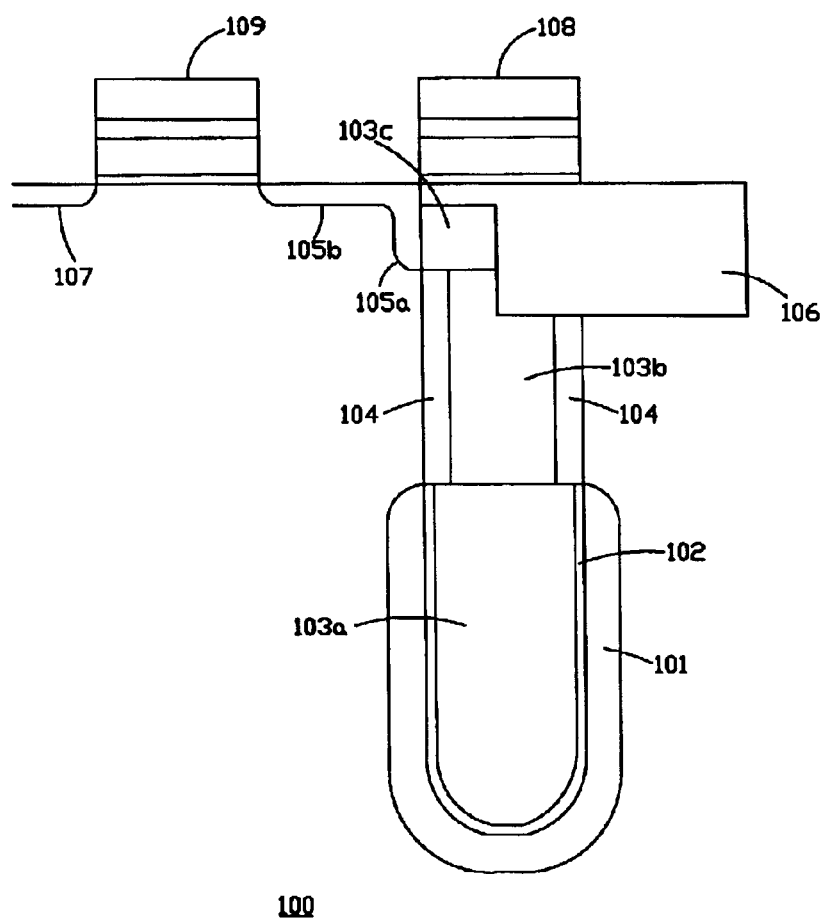
FIG. 1 shows a typical schematic diagram of a trench-type DRAM cell of the prior art.

However, it is clearly seen that a masking photoresist step (PR3) is not required for forming FIG. 3I(b). It should be noted that the surface area of each deep-trench capacitor region as shown in FIG. 3I(a) and FIG. 3I(b) can be made to be smaller than $3F^2$ with including a second-type shallow-trench-isolation region 308c/308d, however the surface area of each deep-trench capacitor region as shown in FIG. 1 is larger or equal to $3F^2$.

Figure 4A:
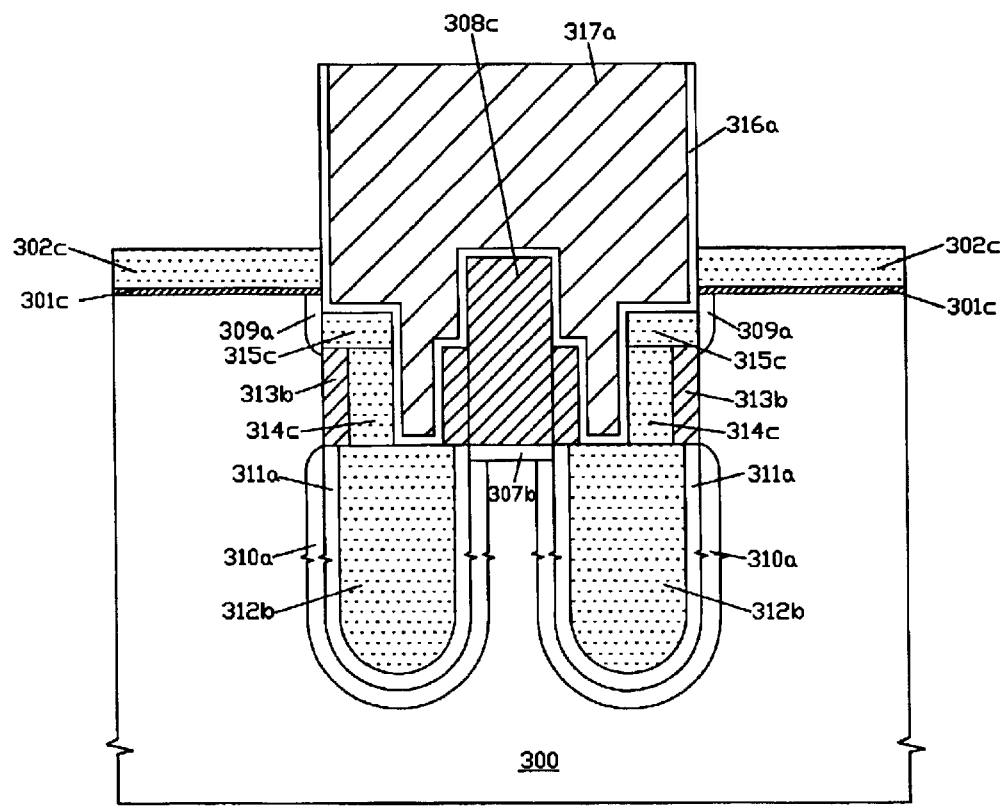
FIG. 4A through FIG. 4C show the process steps and their cross-sectional views of fabricating a self-aligned DRAM transistor structure and its first-type contactless DRAM arrays of the present invention.
Figure 4B:
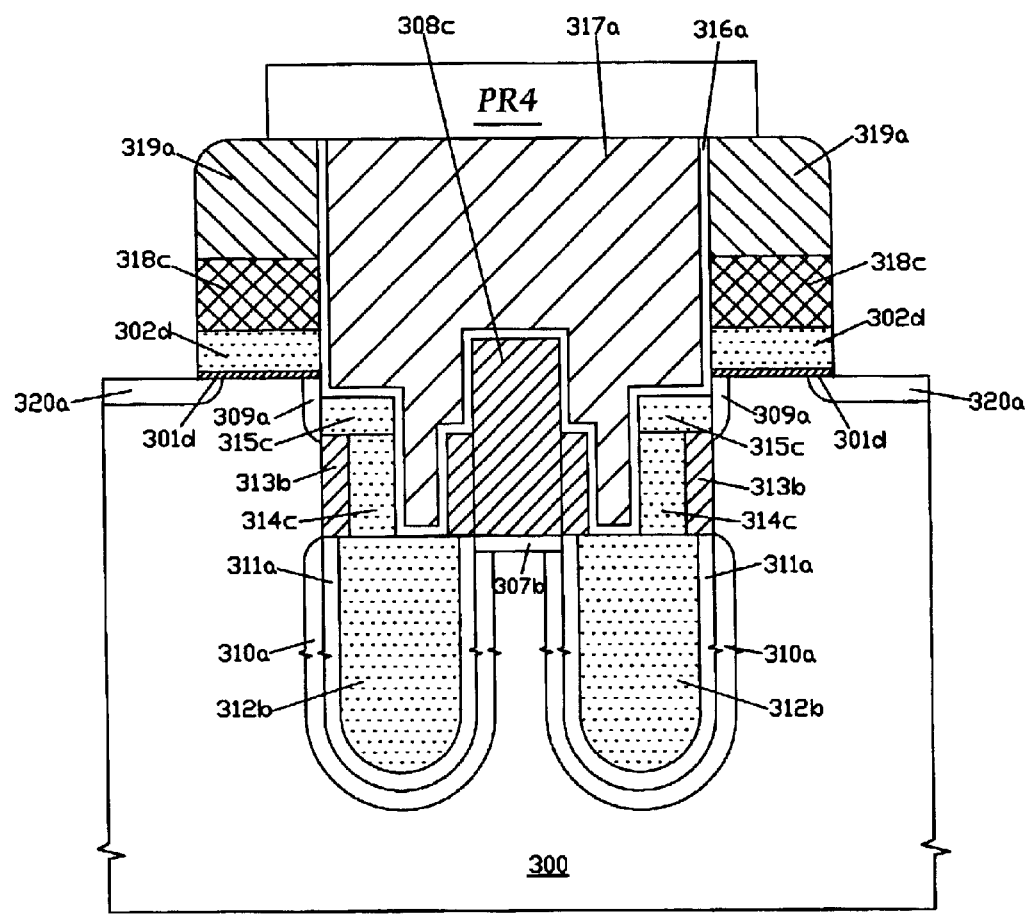
Figure 4C:
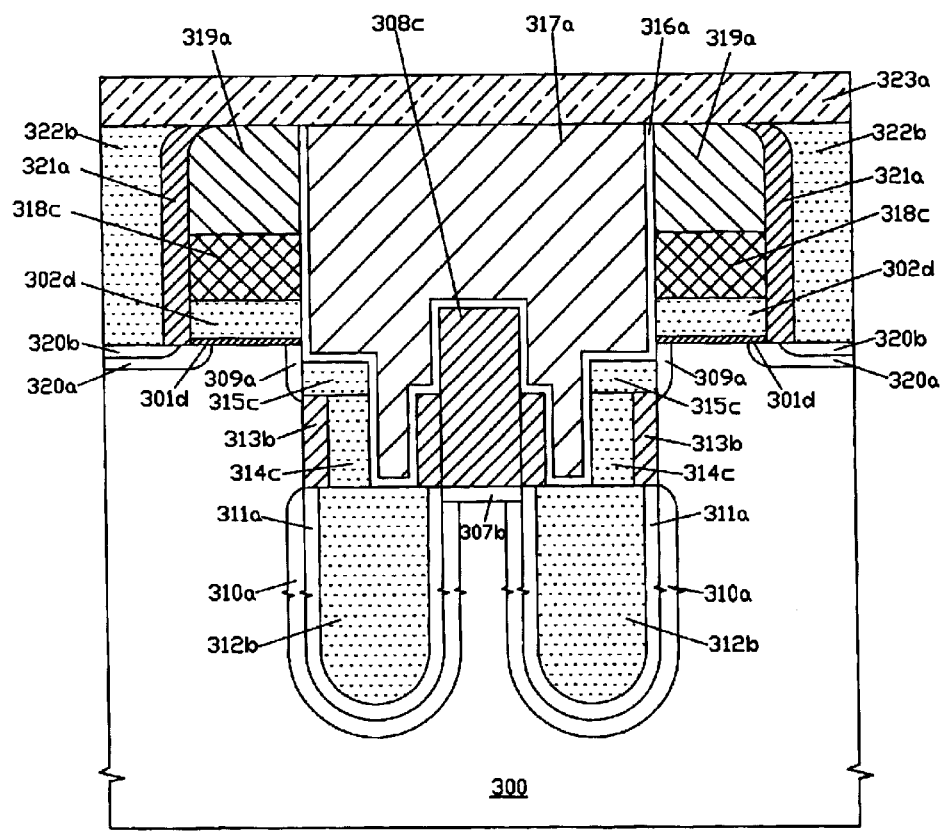
Figure 4C:
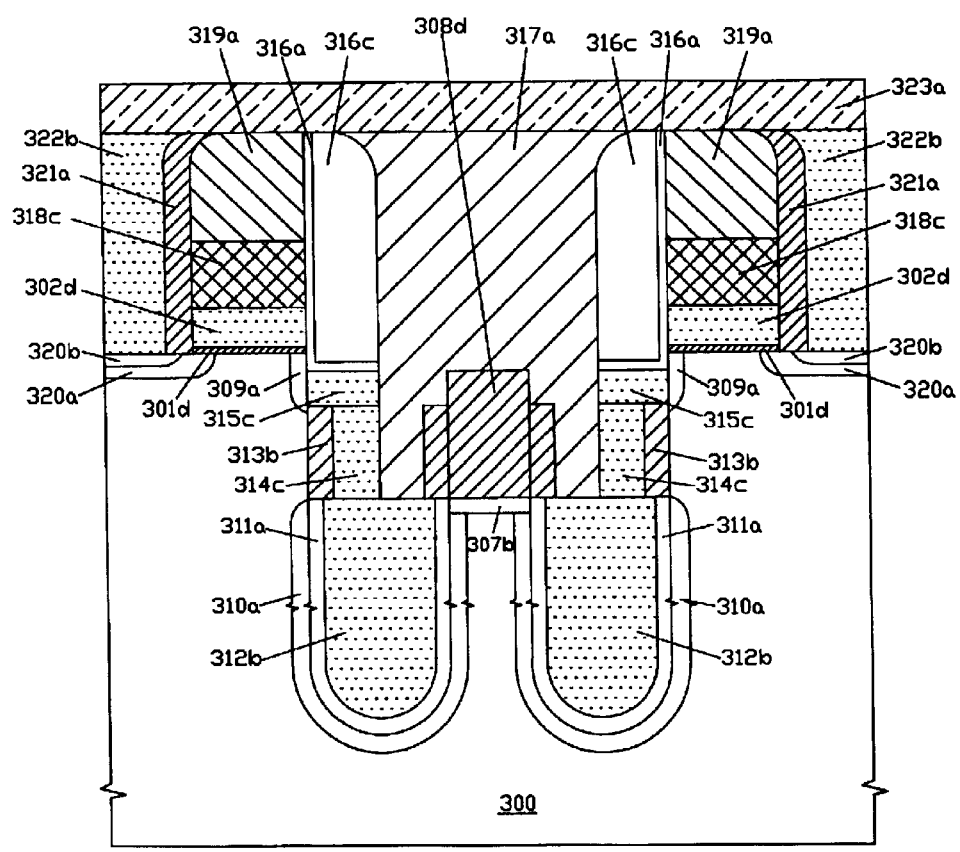

Referring now to FIG. 4A(a) through FIG. 4C(a), there are shown the process steps and their cross-sectional views for forming a self-aligned DRAM transistor structure and its first-type DRAM array after FIG. 3I(a). Similarly, the process steps for forming a self-aligned DRAM transistor structure and its first-type DRAM array of the present invention after FIG. 3I(b) are the same, so the plots are neglected. FIG. 4A(a) shows that the second masking dielectric layers 305a are selectively removed by using hot-phosphoric acid or anisotropic dry etching. It should be noted that different depths and doses of ion implantations (not shown) can be performed in a self-aligned manner to at least form a deep implant region in a central portion of the collar-oxide layer 313b to increase the threshold voltage and the punch-through voltage of the parasitic collar transistors and to form a shallow implant region in a central portion of the common-source diffusion regions 309a with or without the first conductive-gate layers 302c. If the first conductive-gate layers 302c are selectively removed by anisotropic dry etching for forming the deep and shallow implant regions as described, the first gate-dielectric layers 301c can be removed by anisotropic dry etching or dipping in dilute hydrofluoric acid after ion-implantations, then a second gate-dielectric layer 301c can be regrown and a second conductive-gate layer 302c can be reformed as shown in FIG. 4A(a). The shallow implant region as described may comprise a shallower implant region for threshold-voltage adjustment and a deeper implant region for forming a punch-through stop.

FIG. 4B(a) shows that a capping conductive-gate layer 318b is formed over the first or second conductive-gate layer 302c and a pair of third sidewall dielectric spacers 319a are formed over outer sidewalls of nearby deep trench regions and on the capping conductive-gate layer 318b in each of the plurality of self-aligned transistor regions. The capping conductive-gate layer 318b is preferably a tungsten-silicide ($WSi_2$) or tungsten (W) layer as deposited by LPCVD or sputtering and is formed by first depositing a thick conductive layer 318 to fill up a gap in each of the plurality of self-aligned transistor regions and then planarizing the deposited thick conductive layer 318 using CMP and subsequently etching back. The third sidewall dielectric spacer 319a is preferably made of silicon-nitride or silicon-oxynitride as deposited by LPCVD and is used to define a gate length of excess transistors. FIG. 4B(a) also shows that a plurality of masking photoresist PR4 are formed over the plurality of self-aligned trench regions and a portion of nearby third sidewall dielectric spacers 319a; and the capping conductive-gate layers 318b, the first-type first raised field-oxide layers 304b, and the first or second conductive-gate layers 302c outside of the pair of third sidewall dielectric spacers 319a are sequentially removed or etched to form a flat surface between the pair of third sidewall dielectric spacers 319a in each of the plurality of self-aligned transistor regions; an ion-implantation is then performed by implanting doping impurities across the first or second gate-dielectric layer 301c into the semiconductor substrate 300 of the plurality of active regions between the pair of third sidewall dielectric spacers 319a in a self-aligned manner to form lightly doped common-drain diffusion regions 320a of the second conductivity type; and subsequently, the first or second gate-dielectric layers 301c between the pair of third sidewall dielectric spacers 319a are removed and the first-type second raised field-oxide layers 304ec are simultaneously etched to form a flat bed being alternately formed by a lightly-doped common-drain diffusion region 320a and a first-type fifth raised field-oxide layer 304f (not shown).

FIG. 4C(a) shows that the plurality of masking photoresist PR4 are stripped; a second thin silicon-dioxide layer 321 is formed over the formed structure and an ion-implantation is then performed by implanting doping impurities across the second thin silicon-dioxide layer 321 to form a heavily doped common-drain diffusion region 320b of the second conductivity type within the lightly-doped common-drain diffusion region 320a; a rapid-thermal-annealing (RTA) process can be performed at this stage to activate or redistribute the implanted doping impurities, and a second thicker silicon-dioxide layer 321c is formed over the second thin silicon-dioxide layer 321 and is etched back to a thickness of the second thicker silicon-dioxide layer 321c plus the second thin silicon-dioxide layer 321 to form a pair of composite fourth sidewall dielectric spacers 321a in each of the plurality of self-aligned transistor regions; a planarized common-drain conductive layer 322a is formed over the flat bed between the pair of composite fourth sidewall dielectric spacers 321a; and a metal layer 323 is formed over the whole structure and is patterned to be aligned above the plurality of active regions by using a photo-masking step to form a plurality of metal bit-lines 323a integrated with a plurality of planarized common-drain conductive islands 322b. The second thin silicon-dioxide layer 321 is preferably deposited by LPCVD or HTO and its thickness is preferably between 200 Angstroms and 500 Angstroms. The second thicker silicon-dioxide layer 321c is preferably deposited by LPCVD or HTO and its thickness is preferably between 500 Angstroms and 1000 Angstroms. The planarized common-drain conductive layer 322a is preferably made of doped polycrystalline-silicon and is further implanted with a high dose of doping impurities of the second conductivity type and is then preferably silicided with a refractory metal-silicide layer such as a titanium-disilicide (TiSi$_2$) or cobalt-disilicide (CoSi$_2$) layer by using a well-known self-aligned silicidation process. The metal layer 323a is preferably an aluminum or copper layer being formed on a barrier-metal layer such as a titanium-nitride (TiN) or tantalum-nitride (TaN) layer. The photo-masking step comprises a plurality of masking photoresist PR5 being patterned to be aligned above the plurality of active regions or a plurality of hard masking dielectric layers being patterned to be aligned above the plurality of active regions and a sidewall dielectric spacer being formed over each sidewall of the plurality of hard masking dielectric layers to eliminate misalignment.

FIG. 4C(b) shows a self-aligned DRAM transistor structure and its first-type contactless DRAM memory array being formed after FIG. 3I(b). From FIG. 4C(a) and FIG. 4C(b), the DRAM transistor is formed in a self-aligned manner by using a, spacer-formation technique, and its gate length and common-drain diffusion region can be designed to be smaller than a minimum-feature-size (F) of technology used. Therefore, the DRAM cell size of the present invention can be fabricated to be smaller than 6F$^2$.

Figure 5A:
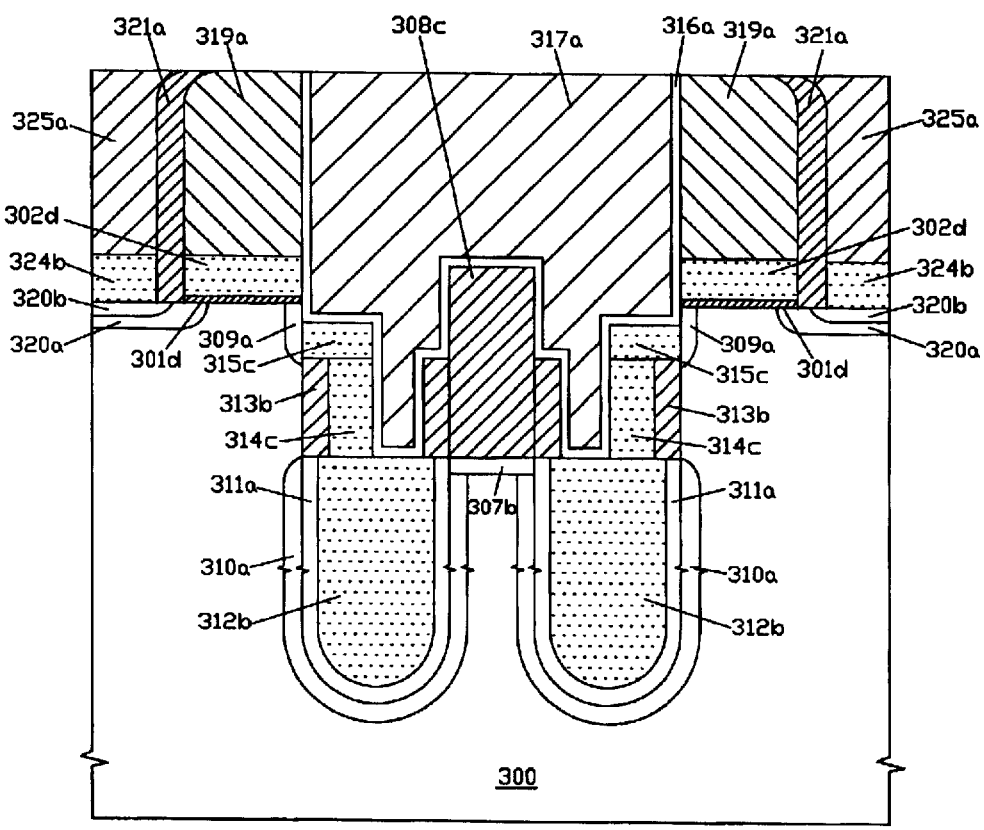
FIG. 5A through FIG. 5C show the process steps and their cross-sectional views of fabricating a self-aligned DRAM transistor structure and its second-type contactless DRAM arrays of the present invention.
Figure 5B:
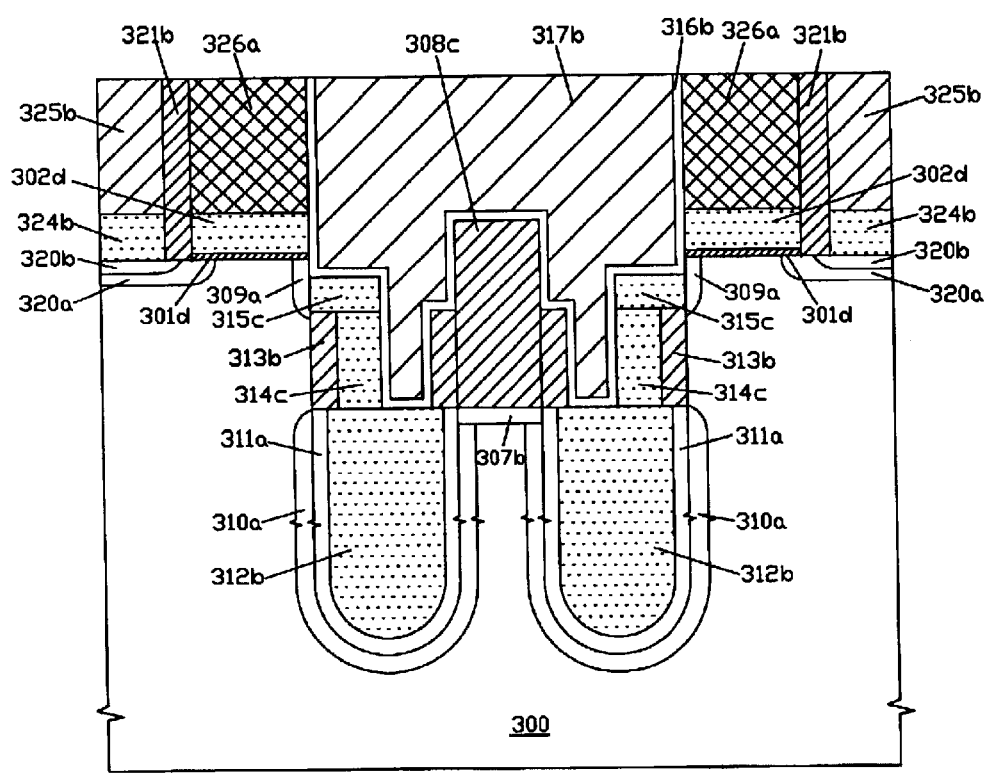
Figure 5C:
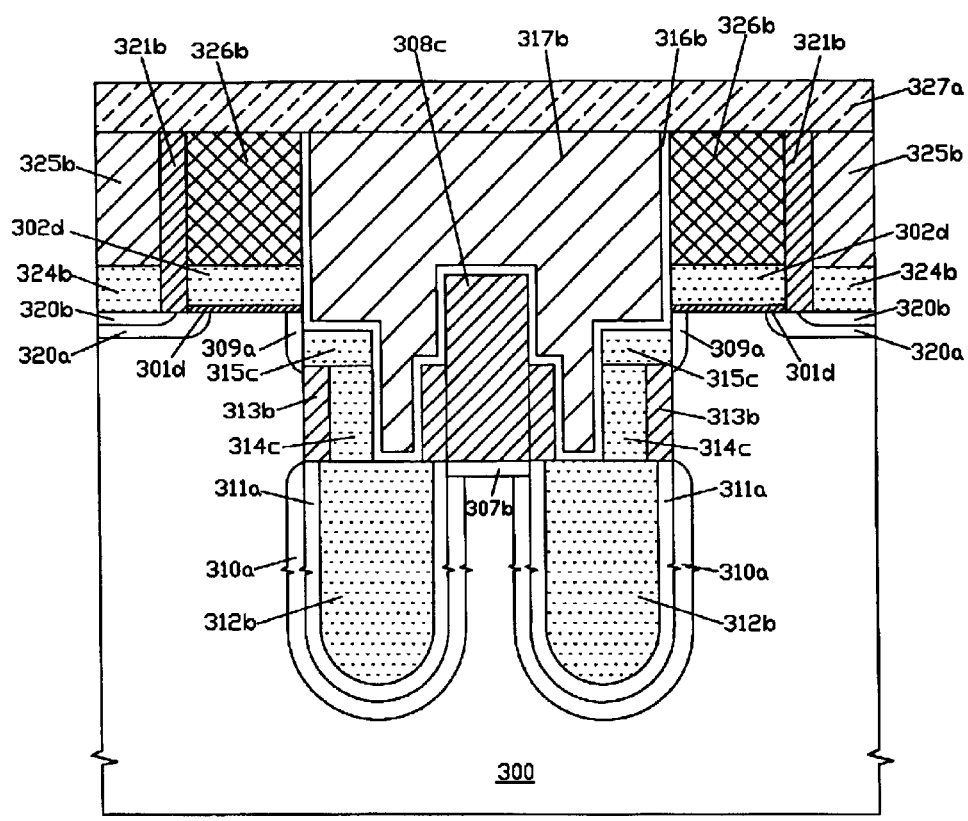
Figure 5C:
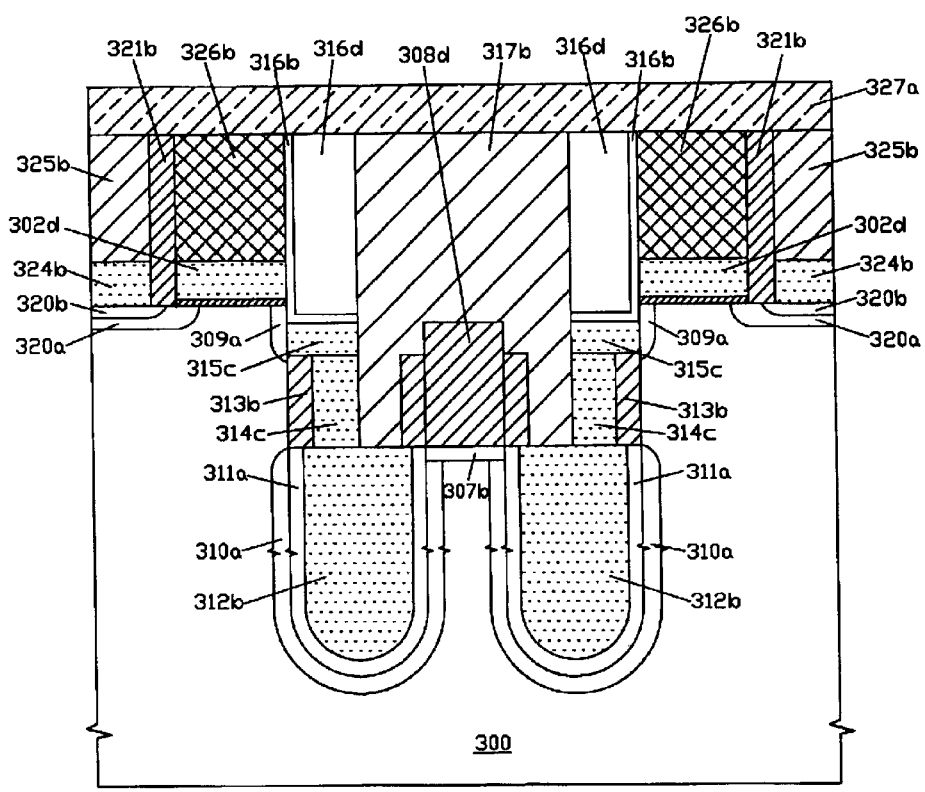

Referring now to FIG. 5A(a) through FIG. 5C(a), there are shown the process steps and their cross-sectional views of fabricating a self-aligned DRAM transistor structure and its second-type contactless DRAM array after FIG. 3I(a). FIG. 5A(a) shows that after the formation of a deep implant region and a shallow implant region as described in FIG. 4A(a), a pair of third sidewall dielectric spacers 319a is formed over outer sidewalls in nearby deep-trench regions and on a flat surface formed alternately by the first or second conductive layer 302c and the first-type first raised field-oxide layer 304b to define the gate length of excess transistors; a plurality of masking photoresist PR4 (not shown) are formed over the plurality of self-aligned trench regions and a portion of nearby third sidewall dielectric spacers 319a; the first-type first raised field-oxide layers 304b outside of the pair of third sidewall dielectric spacers 319a are etched by anisotropic dry etching to a depth equal to a thickness of the first or second conductive-gate layer 302c to form first-type fourth raised field-oxide layers 304e (not shown) and the first or second conductive layer 302c is then selectively removed by anisotropic dry etching; an ion-implantation is performed by implanting doping impurities across the first or second gate-dielectric layer 301c into the semiconductor substrate 300 of the plurality of active regions between the pair of third sidewall dielectric spacers 319a to form lightly-doped common-drain diffusion regions 320a of the second conductivity type; the first or second gate-dielectric layers 301c are then removed by anisotropic dry etching or dipping in dilute hydrofluoric acid and the first-type fourth raised field-oxide layers 304e are simultaneously etched to form a flat bed between the pair of third sidewall dielectric spacers 319a, and the plurality of masking photoresist PR4 are then stripped; a second thin silicon-dioxide layer 321 is formed over the formed structure surface and an ion-implantation is performed by implanting doping impurities across the second thin silicon-dioxide layers 321 into the semiconductor substrate 300 to form a shallow heavily-doped common-drain diffusion region 320b of the second conductivity type within the lightly-doped common-drain diffusion region 320a; a second thicker silicon-dioxide layer 321c is formed over the second thin silicon-dioxide layer 321 and is then etched back to a thickness of the second thicker silicon-dioxide layers 321c plus the second thin silicon-dioxide layer 321 to form a pair of composite fourth sidewall dielectric spacers 321a in each of the plurality of self-aligned transistor regions; a common-drain conductive bus line 324b is formed over the flat bed between the pair of composite fourth sidewall dielectric spacers 321a, wherein the flat bed is alternately formed by a first-type fifth raised field-oxide layer 304f (not shown) and a shallow heavily-doped common-drain diffusion region 320b; and a second planarized thick-oxide layer 325a is then formed over the common-drain conductive bus line 324b between the pair of composite fourth sidewall dielectric spacers 321a. The third sidewall dielectric spacer 319a is preferably made of silicon-nitride or silicon-oxynitride as deposited by LPCVD and its spacer width is mainly used to define the gate: length of excess transistors. The composite fourth sidewall dielectric spacer 321a is preferably made of silicon-dioxide as deposited by LPCVD or HTO and its spacer width is preferably between 200 Angstroms and 1000 Angstroms. The common-drain conductive bus line 324b is preferably a doped polycrystalline-silicon layer being heavily implanted with a high dose of doping impurities of the second conductivity type and being capped with a tungsten-disilicide (WSi$_2$) layer or silicided with a refractory metal-silicide layer such as a titanium-disilicide (TiSi$_2$) or cobalt-disilicide ($CoSi_2$) layer using the well-known self-aligned silicidation process.

FIG. 5B(a) shows that the second planarized thick-oxide layers 325a, the pair of composite fourth sidewall dielectric spacers 321a, the first planarized thick-oxide layers 317a, and the first thin silicon-dioxide layers 316a are etched back by using anisotropic dry etching or buffered hydrofluoric acid to remove the curve portion of the pair of composite fourth sidewall dielectric spacers 321a and the pair of third sidewall dielectric spacers 319a are selectively removed by hot-phosphoric acid or anisotropic dry etching; and subsequently, a planarized metal layer 326a being lined with a barrier-metal layer is formed to fill up each gap formed by the removed third sidewall dielectric spacers 319a. The planarized metal layer 326a is preferably made of tungsten (W), aluminum or copper, and the barrier-metal layer is preferably made of titanium-nitride (TiN) or tantalum-nitride (TaN).

FIG. 5C(a) shows that a metal layer 327 (not shown) is formed over the planarized structure surface shown in FIG. 5B(a) together with the planarized metal layers 326a is patterned by a photo-masking step to form a plurality of metal word-lines 327a integrated with a plurality of planarized conductive-gate islands 326b. The metal layer 327 is preferably an aluminum or copper layer being formed over a barrier-metal layer such as a titanium-nitride or tantalum-nitride layer. The photo-masking step comprises a plurality of masking photoresist being patterned to be aligned above the plurality of active regions or a plurality of hard masking dielectric layers being patterned to be aligned above the plurality of active regions and a sidewall dielectric spacer being formed over each sidewall of the plurality of hard masking dielectric layers to eliminate misalignment.

From FIG. 5C(a), the plurality of metal word-lines are formed transversely to the plurality of common-drain conductive bus lines 324b being acted as a plurality of bit lines to form a second-type contactless DRAM array of the present invention.

FIG. 5C(b) shows a self-aligned DRAM transistor structure and its second-type contactless DRAM memory array being formed after FIG. 3I(b). Similarly, it is clearly seen from FIG. 5C(a) and FIG. 5C(b) that the DRAM transistor is formed in a self-aligned manner by using a spacer-formation technique, and its gate length and common-drain diffusion region can be designed to be smaller than a minimum-feature-size (F) of technology used. Therefore, the DRAM cell size of the present invention can be fabricated to be smaller than $6F^2$.

Accordingly, the advantages and the features of a self-aligned trench-type DRAM structure and its contactless DRAM arrays of the present invention can be summarized below:

(a) The self-aligned trench-type DRAM capacitor structure of the present invention can offer a smaller surface area for shallow-trench-isolation (STI) region between nearby deep-trench capacitors by using a spacer formation technique as compared to the prior art.

(b) The self-aligned trench-type DRAM transistor structure of the present invention can offer scalable gate length and common-drain region for excess transistor with a merged common-source region of zero space.

(c) The self-aligned trench-type DRAM cell of the present invention can offer a cell size smaller than $6F^2$.

(d) The self-aligned trench-type DRAM structure and its contactless DRAM arrays of the present invention can be manufactured with less masking photoresist steps.

(e) The first-type contactless DRAM array of the present invention offers a plurality of metal bit-lines and a plurality of highly conductive word lines for high-speed read and write operations.

(f) The second-type contactless DRAM array of the present invention offers a plurality of metal word-lines and a plurality of highly conductive bit-lines for high-speed read and write operations.

(g) The contactless DRAM arrays of the present invention offer highly-doped polycrystalline-silicon layers or islands for connecting common-drain diffusion regions to eliminate the contact problem of shallow common-drain junction depth.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made without departure from the true spirit and scope of the invention.

What is claimed is:

1. A self-aligned trench-type DRAM structure, comprising:

a semiconductor substrate of a first conductivity type having an active region and two parallel first-type shallow-trench-isolation (STI) regions, wherein said active region is located between said two parallel first-type STI regions;

a DRAM cell comprising a self-aligned trench region and a self-aligned transistor region being formed on said semiconductor substrate, wherein said self-aligned trench region comprises a deep-trench region and a second-type STI region being located in said active region outside of said deep-trench region and said self-aligned transistor region comprises a gate-stack region and a common-drain region;

said deep-trench region being defined by a first sidewall dielectric spacer comprising: a trench capacitor being formed in a lower portion, a collar-oxide layer together with a capacitor-node connector being formed in a middle portion and a source conductive node acted as a dopant diffusion source being formed in an upper portion, wherein said trench capacitor comprises an upper capacitor node over a capacitor-dielectric layer being formed over a lower capacitor node in said semiconductor substrate;

said gate-stack region comprising a gate-stack being defined by a third sidewall dielectric spacer formed over a sidewall of said self-aligned trench region and a common-source diffusion region of a second conductivity type formed by out-diffusion of said dopant diffusion source being formed in said active region under an inner side portion of said gate-stack; and said common-drain region being located outside of said gate-stack comprising a flat bed being formed by a heavily-doped drain diffusion region of said second conductivity type formed within a common-drain diffusion region of said second conductivity type in said active region and two first-type fifth raised field-oxide layers in said two parallel first-type STI regions, and a fourth sidewall dielectric spacer being formed over an outer sidewall of said gate-stack and on a portion of said flat bed.

2. The self-aligned trench-type DRAM structure according to claim 1, wherein said gate-stack comprises said third sidewall dielectric spacer being formed on an elongated conductive-gate layer, said elongated conductive-gate layer acted as a word line being formed on a conductive-gate layer in said active region and two first-type first raised field-oxide layers in said two parallel first-type STI regions, and said conductive-gate layer being formed on a gate-dielectric layer.

3. The self-aligned trench-type DRAM structure according to claim 1, wherein a planarized common-drain conductive island is formed on said heavily-doped drain diffusion region formed within said common-drain diffusion region outside of said fourth sidewall dielectric spacer and a metal bit line integrated with said planarized common-drain conductive island are simultaneously patterned by a photo-masking step to be aligned above said active region.

4. The self-aligned trench-type DRAM structure according to claim 1, wherein a common-drain conductive bus line being acted as a bit line is formed on said flat bed outside of said fourth sidewall dielectric spacer and a second planarized thick-oxide layer is formed on said common-drain conductive bus line.

5. The self-aligned trench-type DRAM structure according to claim 1, wherein said gate-stack comprises a planarized conductive-gate island being formed on a conductive-gate layer in said active region and said conductive-gate layer being formed on a gate-dielectric layer and a metal word line integrated with said planarized conductive-gate island are simultaneously patterned by a photo-masking step to be aligned above said active region.

6. The self-aligned trench-type DRAM structure according to claim 1, wherein said source conductive node and said capacitor-node connector are simultaneously patterned by a second sidewall dielectric spacer lined with a thin silicon-dioxide layer being formed over an inner sidewall of said gate stack and on a flat surface being formed by said source conductive node in said deep trench region and a second-type third raised field-oxide layer in said second-type STI regions and two first-type third raised field-oxide layers in said two parallel first-type STI regions and a first planarized thick-oxide layer is formed in a top portion of said self-aligned trench region outside of said second sidewall dielectric spacer.

7. The self-aligned trench-type DRAM structure according to claim 1, wherein said source conductive node and said capacitor-node connector are simultaneously patterned by a masking photoresist step with a masking photoresist being formed on said self-aligned transistor region and a flat surface being formed by said source conductive node in said deep-trench region and two first-type second raised field-oxide layers in said two parallel first-type STI regions and a first planarized thick-oxide layer lined with a thin silicon-dioxide layer is formed in a top portion of said self-aligned trench region with a second-type second raised field-oxide layer being formed in said second-type STI region and said two first type second raised field-oxide layers being formed in said two parallel first-type STI regions.

8. The self-aligned trench-type DRAM structure according to claim 1, wherein a bottom surface level of said second-type STI region is approximately equal to or slightly above that of said collar-oxide layer and a heavily-implanted region of said second conductivity type is formed under said second-type STI region and is connected with said lower capacitor node being formed by a heavily-doped diffusion region of said second conductivity type.

9. The self-aligned trench-type DRAM structure according to claim 1, wherein a first implant region of said first conductivity type comprising a shallow implant region for threshold-voltage adjustment and a deep implant region for forming a first punch-through stop is formed in a surface portion of the semiconductor substrate under a gate-dielectric layer and a second implant region of said first conductivity type being acted as a second punch-through stop is formed in said semiconductor substrate near a middle portion of said collar-oxide layer.

10. A contactless self-aligned DRAM array, comprising:
a semiconductor substrate of a first conductivity type having a plurality of active regions and a plurality of parallel first-type shallow-trench-isolation (STI) regions formed alternately;
a plurality of self-aligned trench regions and a plurality of self-aligned transistor regions being formed alternately on said semiconductor substrate and transversely to the plurality of active regions, wherein each of the plurality of self-aligned trench regions comprises a plurality of paired deep-trench regions and a plurality of second-type STI regions being formed between the plurality of paired deep-trench regions in the plurality of active regions and each of the plurality of self-aligned transistor regions comprises a pair of gate-stack regions and a common-drain region being formed between said pair of gate-stack regions;
the plurality of paired deep-trench regions being defined by a pair of first sidewall dielectric spacers formed over inner sidewalls of nearby gate-stacks in each of the plurality of self-aligned trench regions, wherein each of said paired deep-trench regions comprises: a trench capacitor being formed in a lower portion, a collar-oxide layer together with a capacitor-node connector being formed in a middle portion, and a source conductive node acted as a dopant diffusion source being formed in an upper portion;
said pair of gate-stack regions being defined by a pair of third sidewall dielectric spacers formed over outer sidewalls of nearby self-aligned trench regions comprising a pair of gate-stacks and a common-source diffusion region of a second conductivity type formed by out-diffusion of said dopant diffusion source being formed in each of the plurality of active regions under an inner side portion of said pair of gate-stacks; and
said common-drain region being located between said pair of gate-stacks comprising a flat bed being alternately formed by a heavily-doped drain diffusion region of said second conductivity type formed within a common-drain diffusion region of said second conductivity type in each of the plurality of active regions and a first-type fifth raised field-oxide layer in each of the plurality of parallel first-type STI regions, and a pair of fourth sidewall dielectric spacers being formed over outer sidewalls of said pair of gate-stacks and on a portion of said flat bed.

11. The contactless self-aligned DRAM array according to claim 10, wherein each of said pair of gate-stacks comprises each of said pair of third sidewall dielectric spacers being formed over an elongated conductive-gate layer, said elongated conductive-gate layer acted as a word line being formed over a flat surface alternately formed by a conductive-gate layer in each of the plurality of active regions and a first-type first raised field-oxide layer in each of the plurality of parallel first-type STI regions, and said conductive-gate layer being formed on a gate-dielectric layer.

12. The contactless self-aligned DRAM array according to claim 10, wherein a plurality of planarized common-drain conductive islands are formed on said heavily-doped drain diffusion regions formed within said common-drain diffusion regions between said pair of fourth sidewall dielectric spacers and a plurality of metal bit lines integrated with the plurality of planarized common-drain conductive islands in said common-drain region are simultaneously patterned by a photo-masking step to be aligned above the plurality of active regions.

13. The contactless self-aligned DRAM array according to claim 10, wherein a common-drain conductive bus line being acted as a bit line is formed over said flat bed between said pair of fourth sidewall dielectric spacers and a second planarized thick-oxide layer is formed on said common-drain conductive bus line.

14. The contactless self-aligned DRAM array according to claim 10, wherein each of said pair of gate-stacks comprises a plurality of planarized conductive-gate islands being formed over a plurality of conductive-gate layers in the plurality of active regions and the plurality of conductive-gate layers being formed on a plurality of gate-dielectric layers, and a plurality of metal word lines integrated with the plurality of planarized conductive-gate islands in each of said pair of gate-stacks are simultaneously patterned by a photo-masking step to be aligned above the plurality of active regions.

15. The contactless self-aligned DRAM array according to claim 10, wherein said source conductive nodes and said capacitor-node connectors in each of the plurality of self-aligned trench regions are simultaneously patterned by a pair of second sidewall dielectric spacers lined with a pair of thin silicon-dioxide layers being formed over inner sidewalls of nearby gate-stacks and on a flat surface being alternately formed by said source conductive node and a second-type third raised field-oxide layer in each of the plurality of second-type STI regions and a first-type third raised field-oxide layer in each of the plurality of parallel first-type STI regions.

16. The contactless self-aligned DRAM array according to claim 10, wherein said source conductive nodes and said capacitor-node connectors in each of the plurality of self-aligned trench regions are simultaneously patterned by a masking photoresist step with a plurality of masking photoresist being formed on the plurality of self-aligned transistor regions and nearby source conductive nodes in the plurality of paired deep trench regions and nearby first-type second raised field-oxide layers in the plurality of parallel first-type STI regions and a first planarized thick-oxide layer lined with a thin silicon-dioxide layer is formed in a top portion of each of the plurality of self-aligned trench regions with a second-type second raised field-oxide layer being formed in each of the plurality of second-type STI regions and said first-type second raised field-oxide layer being formed in each of the plurality of parallel first-type STI regions.

17. The contactless self-aligned DRAM array according to claim 10, wherein a bottom surface level of each of the plurality of second-type STI regions is approximately equal to or slightly above that of said collar-oxide layer and a heavily-implanted region of said second conductivity type is formed under each of the plurality of second-type STI regions and is connected with said lower capacitor node being formed by a heavily-doped diffusion region of said second conductivity type.

18. The contactless self-aligned DRAM array according to claim 10, wherein a first implant region of said first conductivity type comprising a shallow implant region for threshold-voltage adjustment and a deep implant region for forming a first punch-through stop is formed in said semiconductor substrate under each of a plurality of gate-dielectric layers in each of said pair of gate-stacks and a second implant region of said first conductivity type being acted as a second punch-through stop is formed in said semiconductor substrate near a middle portion outside of said collar-oxide layer.

* * * * *